United States Patent
Kim et al.

(10) Patent No.: US 11,967,503 B2
(45) Date of Patent: Apr. 23, 2024

(54) METHOD OF DEPOSITING THIN FILM AND METHOD OF MANUFACTURING SEMICONDUCTOR DEVICE USING THE SAME

(71) Applicant: WONIK IPS CO., LTD., Pyeongtaek-si (KR)

(72) Inventors: Su In Kim, Pyeongtaek-si (KR); Young Chul Choi, Hwaseong-si (KR); Chang Hak Shin, Pyeongtaek-si (KR); Min Woo Park, Osan-si (KR); Ji Hyun Kim, Uijeongbu-si (KR); Kyung Mi Kim, Osan-si (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 229 days.

(21) Appl. No.: 17/360,982

(22) Filed: Jun. 28, 2021

(65) Prior Publication Data
US 2022/0028687 A1    Jan. 27, 2022

(30) Foreign Application Priority Data
Jul. 22, 2020    (KR) .................. 10-2020-0091046

(51) Int. Cl.
*H01L 21/02* (2006.01)
*H01J 37/32* (2006.01)

(52) U.S. Cl.
CPC .. *H01L 21/02274* (2013.01); *H01J 37/32009* (2013.01); *H01J 37/32522* (2013.01); *H01L 21/0214* (2013.01)

(58) Field of Classification Search
CPC ............ H01L 21/02274; H01L 21/0214; H01J 37/32009; H01J 37/32522
See application file for complete search history.

(56) References Cited

U.S. PATENT DOCUMENTS

| | | | | |
|---|---|---|---|---|
| 2002/0028584 | A1* | 3/2002 | Oku | C23C 16/509 257/E21.279 |
| 2003/0143821 | A1* | 7/2003 | Niino | C23C 16/509 438/484 |

(Continued)

FOREIGN PATENT DOCUMENTS

| | | | |
|---|---|---|---|
| JP | 1994168930 | A | 6/1994 |
| JP | 1997055351 | A | 2/1997 |

(Continued)

*Primary Examiner* — Monica D Harrison
*Assistant Examiner* — Andre C Stevenson
(74) *Attorney, Agent, or Firm* — WILLIAM PARK & ASSOCIATES LTD.

(57) ABSTRACT

Provided are a method of depositing a thin film and a method of manufacturing a semiconductor device using the same, and the method of depositing a thin film uses a substrate processing apparatus including a chamber, a substrate support on which a substrate is mounted, a gas supply unit, and a power supply unit that supplies high-frequency and low-frequency power to the chamber, and includes: a step of mounting, on the substrate support, the substrate including a lower thin film deposited under the condition of a process temperature in a low temperature range; a step of depositing an upper thin film on the lower thin film under the condition of the process temperature in the low temperature range; and a step of treating a surface of the upper thin film under the condition of the process temperature in the low temperature range.

14 Claims, 4 Drawing Sheets

(56) References Cited

U.S. PATENT DOCUMENTS

| | | | | |
|---|---|---|---|---|
| 2006/0258176 | A1* | 11/2006 | Fukazawa | H01L 21/02348 257/E21.279 |
| 2011/0223759 | A1* | 9/2011 | Wang | H01L 21/02211 438/618 |
| 2012/0322181 | A1* | 12/2012 | Noel | H01L 21/02337 257/E33.061 |
| 2013/0280859 | A1* | 10/2013 | Kim | H01L 29/78696 438/104 |
| 2015/0303054 | A1* | 10/2015 | Hanashima | H01L 21/02274 438/758 |
| 2018/0047645 | A1* | 2/2018 | Varadarajan | H01L 21/022 |
| 2022/0051935 | A1* | 2/2022 | Kim | H01L 21/76826 |

FOREIGN PATENT DOCUMENTS

| | | |
|---|---|---|
| JP | 2001015506 A | 1/2001 |
| JP | 2010053397 A | 3/2010 |
| KR | 1020210075266 A | 6/2021 |
| TW | 201330096 A | 7/2013 |
| TW | 201438062 A | 10/2014 |
| TW | 201828339 A | 8/2018 |
| TW | 201841214 A | 11/2018 |
| TW | 201925519 A | 7/2019 |

\* cited by examiner

METHOD OF DEPOSITING THIN FILM AND METHOD OF MANUFACTURING SEMICONDUCTOR DEVICE USING THE SAME

CROSS-REFERENCES TO RELATED APPLICATION

The present application claims priority under 35 U.S.C. § 119(a) to Korean application number 10-2020-0091046, filed on Jul. 22, 2020, in the Korean Intellectual Property Office, which is incorporated herein by reference in its entirety.

BACKGROUND

1. Technical Field

Various embodiments generally relate to a method of depositing a thin film and a method of manufacturing a semiconductor device using the same, and more particularly, to a method of depositing a thin film for forming a hard mask and a method of manufacturing a semiconductor device using the same.

2. Related Art

In manufacturing highly integrated semiconductor devices, miniaturization of patterns is essential. In order to integrate many devices in a narrow area, it is necessary to reduce respective patterns constituting a device and a pitch between the patterns. Recently, as design rules of semiconductor devices are rapidly reduced, there is a limitation in forming a pattern having a fine line width and pitch due to the limitation of exposure of a current photolithography process.

Currently, various etching methods are proposed to restrict a fine pattern below the limitation of exposure, and one of them is a method of using a hard mask.

The hard mask is required to have etching resistance to layers to be etched. Particularly, in the case of a 3D NAND device including a stack structure of a plurality of silicon oxide films and a plurality of silicon nitride films, a stack structure of an amorphous carbon film and a silicon oxynitride film is used as a hard mask to ensure high etching selectivity relative to the stack structure.

A hard mask composed of the amorphous carbon film and the silicon oxynitride film is generally deposited at a high temperature of 450° C. to 650° C. However, when the hard mask is manufactured at such a high temperature, there are problems in that the properties of a lower layer to be etched are degraded and device properties are changed.

Accordingly, in the related art, a technology has been proposed to deposit only the amorphous carbon film relatively adjacent to the layer to be etched at a low temperature of 100° C. to 250° C. However, in the aforementioned method, since the silicon oxynitride film constituting the hard mask is still deposited at a high temperature, damage due to the high temperature may occur in the lower amorphous carbon film. Thus, a pattern defect of a hard mask pattern may occur.

SUMMARY

Various embodiments are directed to providing a method of depositing a thin film, capable of reducing damage to a lower thin film while maintaining etching selectivity relative to the lower thin film, and a method of manufacturing a semiconductor device using the same.

In an embodiment, a method of depositing a thin film may use a substrate processing apparatus including a chamber that defines a processing space therein, a substrate support that is located in a lower area of the chamber and on which a substrate is mounted, a gas supply unit that is located in an upper area of the chamber and provide source gas and reaction gas to the substrate, and a power supply unit that supplies high-frequency and low-frequency power to the chamber, and include: a step of mounting, on the substrate support, the substrate including a lower thin film deposited under a condition of a process temperature in a low temperature range; a step of depositing an upper thin film on the lower thin film in a plasma atmosphere under the condition of the process temperature in the low temperature range; and a step of treating a surface of the upper thin film in the plasma atmosphere under the condition of the process temperature in the low temperature range after the step of depositing the upper thin film, wherein the process temperature in the low temperature range is 100° C. to 250° C.

In an embodiment, a method of manufacturing a semiconductor device may include: a step of forming an underlayer on a semiconductor substrate; a step of depositing, on the underlayer, a lower thin film having etching selectivity relative to the underlayer at a process temperature in a low temperature range; a step of depositing, on the lower thin film, an upper thin film having etching selectivity relative to the lower thin film at the process temperature in the low temperature range; a step of forming a hard mask by plasma-treating the upper thin film; and a step of patterning the underlayer by using the hard mask, wherein the process temperature in the low temperature range is in a range of 100° C. to 250° C., the upper thin film is deposited using reaction gas and source gas contained in a larger amount than the reaction gas, and the plasma treatment is performed by supplying the reaction gas.

In accordance with an embodiment, instead of depositing both a lower thin film and an upper thin film constituting a hard mask at a process temperature in a low temperature range, a method of depositing the upper thin film is changed to compensate for the etching selectivity of the upper thin film. Accordingly, the etching selectivity can be sufficiently compensated for, and the hard mask can be deposited at a low temperature, which makes it possible to substantially prevent pattern defects.

DETAILED DESCRIPTION

Figure 1:
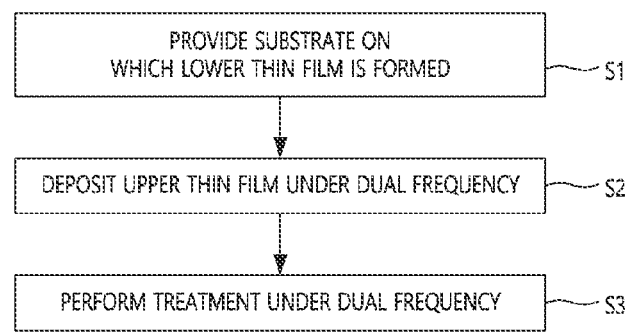
FIG. 1 is a flowchart for explaining a method of manufacturing a semiconductor device including a thin film in accordance with an embodiment.

The advantages and features of the present disclosure and methods for achieving them will become apparent with reference to the following detailed description when considered in conjunction with the accompanying drawings. However, the scope of the present disclosure is not limited to embodiments to be described below and may be realized in various forms, and the present embodiments are nothing but the ones provided to bring the disclosure of the present disclosure to perfection and assist those skilled in the art to completely understand the scope of the present disclosure in the technical field to which the present disclosure pertains. The present disclosure is defined only by the scope of the appended claims. In the drawings, the sizes and relative sizes of layers and areas may be exaggerated for clarity of description. The same reference numerals denote the same elements throughout the drawings.

Figure 2:
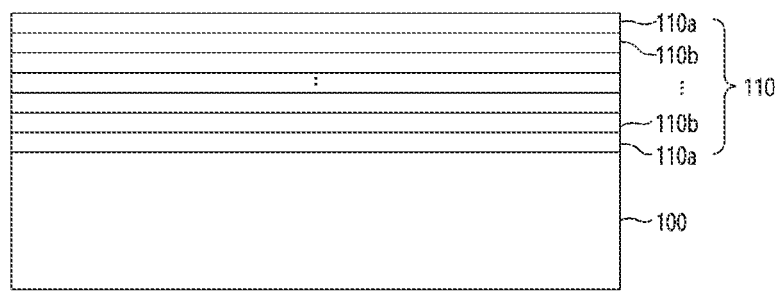
FIG. 2 to FIG. 4 are sectional views for each process explaining a method of manufacturing the semiconductor device including a thin film in accordance with an embodiment.
Figure 3:
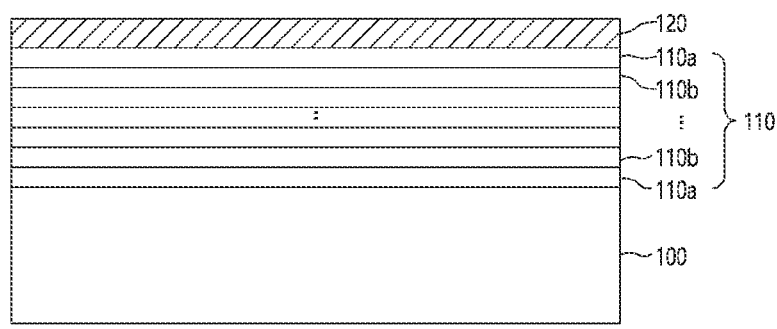
Figure 4:
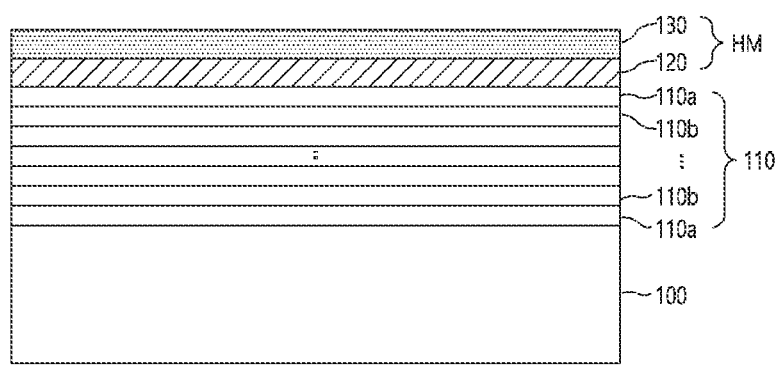

FIG. 1 is a flowchart for explaining a method of manufacturing a semiconductor device including a thin film in accordance with an embodiment. FIG. 2 to FIG. 4 are sectional views for each process explaining a method of manufacturing a semiconductor device including a thin film in accordance with an embodiment.

Referring to FIG. 1 to FIG. 3, a substrate 100, on which a lower thin film 120 is formed, is provided (S1). In the present embodiment, an underlayer 110 corresponding to a layer to be etched may be further formed between the substrate 100 and the lower thin film 120. The underlayer 110 may be, for example, a stack structure in which silicon oxide films 110a and silicon nitride films 110b are alternately and repeatedly stacked. Although not illustrated in detail in the drawings, a separate device layer may be further interposed between the semiconductor substrate 100 and the underlayer 110. The present embodiment illustrates an example of the underlayer 110 in which the silicon oxide films 110a and the silicon nitride films 110b are alternately stacked, but various layers to be etched may correspond to the underlayer 110.

The lower thin film 120 is a material having etching selectivity relative to the underlayer 110 to be etched, and example of the material may include an amorphous carbon film, a titanium oxide film, or a spin on glass (SOG). The lower thin film 120 of the present embodiment may be formed at a process temperature in a low temperature range, for example, 100° C. to 250° C. Accordingly, when the lower thin film 120 is deposited, a thermal effect on the underlayer 110 to be etched may be reduced.

Referring to FIG. 1 and FIG. 4, an upper thin film 130 is deposited on the lower thin film 120 as another part of a hard mask film under a dual frequency (for example, a high frequency and a lower frequency) (S2). As a material film of the upper thin film 130, a material film having etching selectivity relative to the lower thin film 120, for example, a silicon oxynitride film SiON may be used. The upper thin film 130 of the present embodiment may be deposited at a process temperature in a low temperature range, for example, a process temperature of 100° C. to 250° C. in a low temperature range that is substantially the same as the deposition temperature of the lower thin film 120. Accordingly, when the upper thin film 130 is deposited, thermal damage to the lower thin film 120 is not caused. In the drawing, "HM" may refer to a hard mask film.

The upper thin film 130 of the present embodiment, which is made of the silicon oxynitride film, may be formed through a reaction of $SiH_4$ and $N_2O$ gas (or NO gas), for example. As an example, the ratio of $SiH_4$ and $N_2O$ may be 1.2 to 2.5 to 1. By increasing the content of the $SiH_4$ gas relative to the $N_2O$, it is possible to improve etching selectivity of a silicon oxynitride film. Furthermore, the silicon oxynitride film may be formed under the pressure of 1.5 Torr to 4.0 Torr. Furthermore, in the present embodiment, by using $N_2O$ or NO, instead of $NH_3$, as reaction gas for forming the silicon oxynitride film, it is possible to reduce the content of hydrogen (H) in the silicon oxynitride film. Accordingly, it is possible to compensate for the etching selectivity of the silicon oxynitride film due to low temperature deposition.

Figure 5:
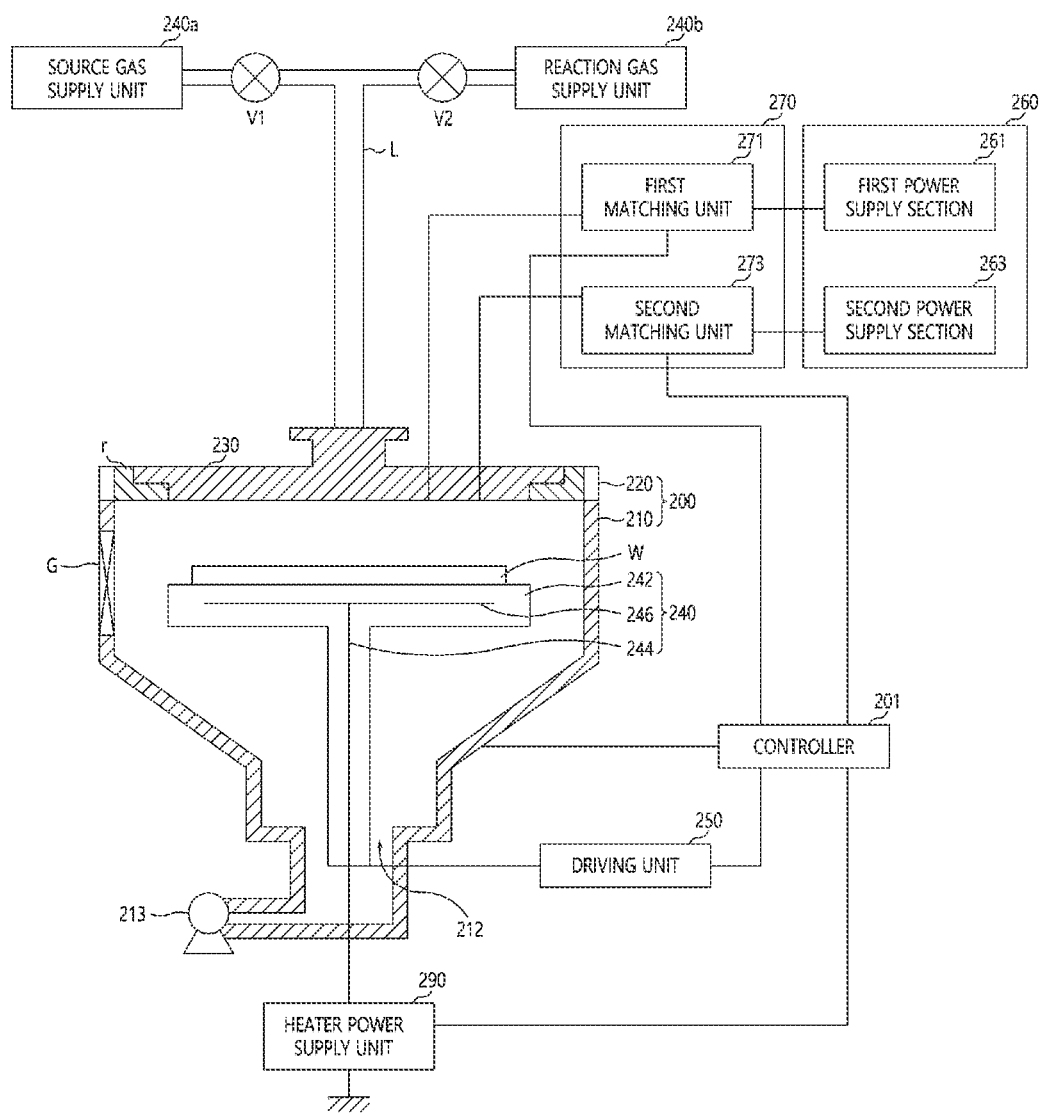
FIG. 5 is a schematic sectional view illustrating a substrate processing apparatus in accordance with an embodiment.

The upper thin film 130 of the present embodiment may be deposited, for example, in a substrate processing apparatus illustrated in FIG. 5.

FIG. 5 is a schematic sectional view illustrating a substrate processing apparatus 150 in accordance with an embodiment.

Referring to FIG. 5, the substrate processing apparatus 150 may include a chamber 200, a controller 201, a shower head 230, a substrate support 240, a driving unit 250, a plasma power supply unit 260, a matching network 270, and a heater power supply unit 290.

The chamber 200 may include a body 210 with an open top and a top lid 220 installed on an outer periphery of the top of the body 210. An internal space of the top lid 220 may be closed by the shower head 230. An insulating ring r may be installed between the shower head 230 and the top lid 220 to electrically insulate the chamber 200 from the shower head 230.

In the internal space of the chamber 200, the upper thin film 130 may be deposited. A gate G, through a substrate W is carried in and out, may be provided at a designated position on the side of the body 210.

In order to vacuumize the inside of the chamber 200, a pump 213 may be connected to an exhaust port 212 located at a lower part of the chamber 200.

The shower head 230 may be installed inside the top lid 220 so as to face the substrate support 240. The shower head 230 may receive various source gases, which are supplied from an exterior, through a gas supply line L, and inject the received source gases into the chamber 200. In the present embodiment, the shower head 230 may serve as a first electrode for generating plasma.

A source gas supply unit 240a and a reaction gas supply unit 240b may be connected to the gas supply line L of the shower head 230 of the present embodiment. In the present embodiment, the source gas supply unit 240a may accommodate, for example, $SiH_4$ gas and the reaction gas supply unit 240b may accommodate, for example, $N_2O$ gas.

FIG. 5 illustrates only the source gas supply unit 240a and the reaction gas supply unit 240b, but a purge gas supply unit and/or a seasoning gas supply unit may also be additionally connected to the gas supply line L. Valves V1 and V2 may be installed between the source gas supply unit 240a and the gas supply line L and between the reaction gas supply unit 240b and the gas supply line L, respectively.

The substrate support 240 may include a substrate mounting part (susceptor) 242 and a support shaft 244. The substrate mounting part 242 may have a flat plate shape as a whole so that at least one substrate W is mounted on the upper surface thereof. The support shaft 244 may be vertically coupled to a rear surface of the substrate mounting part 242, and may be connected to the external driving unit 250 through a through hole at the bottom of the chamber 200 to move the substrate mounting part 242 upward or downward and/or rotate the substrate mounting part 242. In the present embodiment, the substrate mounting part 242 may serve as a second electrode for generating plasma.

Furthermore, a heater 246 may be provided inside the substrate mounting part 242 to adjust the temperature of the substrate 100 mounted thereon and the internal temperature of the chamber 200. The heater power supply unit 290 may be connected to the heater 246 to provide power thereto.

The controller 201 is configured to control the overall operation of the substrate processing apparatus 150. In an embodiment, the controller 201 may control the operation of each of the components 200, 230, 240, 250, 260, 270, 290, V1, and V2 of the substrate processing apparatus 150, and set a control parameter for depositing the upper thin film 130. Although not illustrated, the controller 201 may include a central processing unit, a memory, an input/output interface, and the like.

The plasma power supply unit 260 may include a first power supply section 261 and a second power supply section 263. The first power supply section 261 may provide a plasma power source with high frequency (HF) power having a center frequency band of 10 MHz to 40 MHz, for example, 13.56 MHz. In addition, the second power supply section 263 may provide the plasma power source with low frequency (LF) power having a center frequency band of 300 kHz to 500 kHz, for example, 370 kHz. The controller 201 may control the power, which is supplied from the first power supply section 261 and/or the second power supply section 263, according to the control parameter.

The matching network 270 may include a first matching unit 271 connected to the first power supply section 261 and a second matching unit 273 connected to the second power supply section 263. The first and second matching units 271 and 273 of the matching network 270 may be configured to match the output impedance of the first and second power supply sections 261 and 263 with the load impedance in the chamber 200, respectively, thereby removing reflection loss due to reflection of RF power from the chamber 200.

Figure 6:
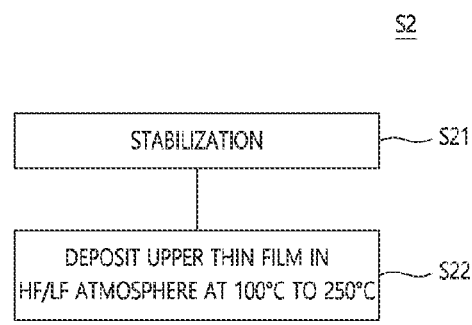
FIG. 6 is a flowchart for explaining a method of depositing an upper thin film in accordance with an embodiment.
Figure 7:
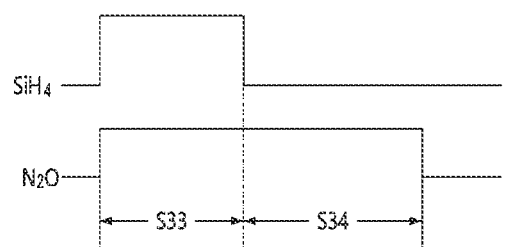
FIG. 7 is a timing diagram for explaining a method of depositing an upper thin film in accordance with an embodiment.

FIG. 6 is a flowchart for explaining a method of depositing the upper thin film in accordance with an embodiment. FIG. 7 is a timing diagram for explaining a method of depositing the upper thin film in accordance with an embodiment.

Referring to FIG. 1, and FIG. 4 to FIG. 7, the step S2 of depositing the upper thin film 130 may include a step S21 of stabilizing the inside of the chamber 200. The stabilization step S21 may be a step of creating an atmosphere capable of depositing the upper thin film 130 at a processing temperature in a low temperature range. In order to deposit the upper thin film 130, for example, a temperature of 100° C. to 250° C. and a pressure of 1.5 Torr to 4.0 Torr may be formed in the chamber 200.

In the state in which the inside of the chamber 200 has been stabilized, the upper thin film 130 is deposited on the lower thin film 120 (S22). As described above, the upper thin film 130 may be formed by supplying the source gas $SiH_4$ and the reaction gas $N_2O$ at a ratio of 1.2 to 2.5 to 1 under the temperature of 100° C. to 250° C. and the pressure of 1.5 Torr to 4.0 Torr. As the ratio of the source gas $SiH_4$ is increased by a predetermined amount compared to the ratio of the reaction gas $N_2O$, it is possible to improve the etching selectivity of the upper thin film 130 relative to the lower thin film 120. As a consequence, it is possible to compensate for the etching selectivity of the upper thin film 130 due to the low temperature deposition.

Furthermore, the upper thin film 130 of the present embodiment is deposited under the dual frequency, that is, a high frequency HF and a lower frequency LF. By using the lower frequency LF, ion energy and ion bombardment are promoted, which makes it possible to compensate for the thermal energy of the upper thin film 130 due to the low temperature deposition and substantially prevent unstable coupling from occurring.

Thereafter, plasma treatment is performed under the dual frequency (S3). The plasma treatment step S3 may be performed by stopping the supply of the source gas $SiH_4$ and supplying only the reaction gas $N_2O$. The plasma treatment step S3 using the $N_2O$ gas may be performed subsequent to the deposition step of the upper thin film 130 at the process temperature in the low temperature range, for example, the temperature of 100° C. to 250° C. The surface of the upper thin film 130 may be modified so that the hardness of the surface of the upper thin film 130 is improved by the plasma treatment. Accordingly, the etching selectivity may be further improved. Although not illustrated in detail in the drawings, an oxide film may also be generated on the surface of the upper thin film 130 by the plasma treatment.

Thereafter, although not illustrated in the drawings, the inside of the process chamber 200 is purged to remove unreacted components and impurities in the chamber 200.

The upper thin film 130 constituting the hard mask film is generally deposited at a high temperature in order to ensure a high etching selectivity. However, when the upper thin film 130 is deposited under the high temperature, thermal damage may be applied to the lower thin film 120 and even the underlayer 110.

Accordingly, in the present embodiment, the upper thin film 130 is deposited at the process temperature in the low temperature range, which does not affect the material properties of the underlayer 110, for example, 100° C. to 250° C., as in the lower thin film 120.

In addition, in order to compensate for the etching selectivity of the upper thin film 130 deposited at the low temperature, the ratio of the source gas is increased compared to the ratio of the reaction gas, and the upper thin film 130 may be deposited under the pressure of 1.5 Torr to 4.0 Torr. Furthermore, in the present embodiment, in order to compensate for the etching selectivity of the upper thin film 130 deposited at the low temperature, the plasma treatment is performed in the low temperature range by supplying only the reaction gas, subsequent to the deposition of the upper thin film 130. Accordingly, by modifying the surface properties of the upper thin film 130, the etching selectivity is compensated for.

Furthermore, by using the $N_2O$ gas having a low hydrogen content as the reaction gas for depositing the upper thin film 130, the etching selectivity can be further compensated for.

Furthermore, in the present embodiment, when the upper thin film 130 is deposited, thermal energy and ion reaction efficiency are compensated for by using LF power together with HF power, so that the etching selectivity of the upper thin film 130 can be additionally compensated for.

Although the present disclosure has been described in detail with reference to a preferred embodiment, the present disclosure is not limited to the above embodiment and various modifications can be made by those skilled in the art within the scope of the technical idea of the present disclosure.

What is claimed is:

1. A thin film deposition method using a substrate processing apparatus including a chamber that defines a processing space therein, a substrate support that is located in a lower area of the chamber and on which a substrate is mounted, a gas supply unit that is located in an upper area of the chamber and provides source gas and reactive gas to the substrate, and a power supply unit that supplies high-frequency power and low-frequency power to the chamber, the thin film deposition method comprising:

depositing a lower thin film under a low temperature range on the substrate;

depositing, on the lower thin film, an upper thin film having etching selectivity relative to the lower thin film at the low temperature range;

performing a plasma treatment of the upper thin film, thereby forming a hard mask including the lower thin film and the upper thin film with the plasma treatment; and treating a surface of the upper thin film in the plasma atmosphere under the low temperature range after depositing the upper thin film, by supplying only the reactive gas;

wherein the low temperature range is 100° C. to 250° C.

2. The thin film deposition method according to claim 1, wherein the source gas includes silicon, the plasma atmosphere is generated by applying at least one of the high-frequency power and low-frequency power, and the reactive gas includes nitrogen and oxygen.

3. The thin film deposition method according to claim 1, wherein, a ratio of the source gas is 1.2~2.5 to 1.

4. The thin film deposition method according to claim 1, wherein the source gas includes a $SiH_4$ gas.

5. The thin film deposition method according to claim 4, wherein the reactive gas includes at least one of $N_2O$ and NO.

6. The thin film deposition method according to claim 1, wherein the upper thin film is deposited under a pressure of 1.5 Torr to 4.0 Torr.

7. The thin film deposition method according to claim 1, wherein the upper thin film includes a silicon oxynitride film.

8. The thin film deposition method according to claim 1, wherein the power supply unit supplies the high frequency power having a center frequency band of 10 MHz to 40 MHz, and the low frequency power having a center frequency band of 300 kHz to 500 kHz.

9. The thin film deposition method according to claim 1, wherein the upper thin film is treated by supplying the reactive gas without supplying the source gas under the plasma atmosphere generated by the high-frequency power and low-frequency power.

10. The thin film deposition method according to claim 1, wherein the upper thin film is sequentially treated while maintaining the plasma atmosphere during deposition of the upper thin film.

11. The thin film deposition method according to claim 1, wherein the lower thin film is an amorphous carbon film, a titanium oxide film, or a spin on glass (SOG).

12. A method of manufacturing a semiconductor device, the method comprising:

forming an underlayer on a semiconductor substrate;

depositing, on the underlayer, a lower thin film having etching selectivity relative to the underlayer at a low temperature range;

depositing, on the lower thin film, an upper thin film having etching selectivity relative to the lower thin film at the low temperature range;

performing a plasma treatment of the upper thin film, thereby forming a hard mask including the lower thin film and the upper thin film with the plasma treatment;

patterning the underlayer by using the hard mask, wherein the low temperature range is in a range of 100° C. to 250° C., the upper thin film is deposited using reactive gas and source gas contained in a larger amount than the reactive gas, and the reactive gas includes nitrogen and oxygen.

13. The method according to claim 12, wherein the plasma treatment is performed by supplying only the reactive gas under a plasma atmosphere generated by the high-frequency power and low-frequency power.

14. The method according to claim 13, wherein the source gas is a SiH4 gas and the reactive gas is at least one of a N2O gas and NO gas.

* * * * *